（12） United States Patent
Cai et al.

(10) Patent No.: US 10,224,508 B2
(45) Date of Patent: Mar. 5, 2019

(54) ORGANIC LIGHT-EMITTING DISPLAY PANEL, METHOD FOR MANUFACTURING ORGANIC LIGHT-EMITTING DISPLAY PANEL AND ORGANIC LIGHT-EMITTING DISPLAY DEVICE

(71) Applicant: SHANGHAI TIANMA MICRO-ELECTRONICS CO., LTD., Shanghai (CN)

(72) Inventors: Xiaobo Cai, Shanghai (CN); Chuanli Leng, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/036,857

(22) Filed: Jul. 16, 2018

(65) Prior Publication Data

US 2018/0342700 A1    Nov. 29, 2018

(30) Foreign Application Priority Data

Mar. 30, 2018  (CN) .......................... 2018 1 0291621

(51) Int. Cl.
*H01L 51/52*     (2006.01)
*H01L 27/32*     (2006.01)
(Continued)

(52) U.S. Cl.
CPC ...... *H01L 51/5256* (2013.01); *H01L 27/3262* (2013.01); *H01L 51/0097* (2013.01);
(Continued)

(58) Field of Classification Search
CPC . H01L 27/1214; H01L 27/32; H01L 27/3244; H01L 27/3225; H01L 27/3248;
(Continued)

(56) References Cited

U.S. PATENT DOCUMENTS

2015/0060778 A1*   3/2015  Kim .................... H01L 27/3258
                                                        257/40
2017/0237033 A1*   8/2017  Koshihara ............. H01L 27/322
                                                        257/88
(Continued)

FOREIGN PATENT DOCUMENTS

CN           106653818 A      5/2017

*Primary Examiner* — Thanh Y. Tran
(74) *Attorney, Agent, or Firm* — Kilpatrick Townsend & Stockton LLP

(57) ABSTRACT

An organic light-emitting display panel, a method for manufacturing the same and an organic light-emitting display device are provided. The organic light-emitting display panel includes a flexible substrate comprising a display region, an aperture region surrounded by the display region, and a first non-display region located between the display region and the aperture region, a thin film transistor layer arranged on the flexible substrate, a light-emitting device layer arranged on the thin film transistor layer and including a first electrode, a light-emitting layer, and a second electrode, an encapsulation layer arranged on the light-emitting device layer and sequentially including a first inorganic encapsulation layer and a first organic encapsulation layer, and borders of the second electrode and the first inorganic encapsulation layer in the first non-display region are aligned, and an inorganic layer covering the borders of the second electrode and the first inorganic encapsulation layer.

20 Claims, 11 Drawing Sheets

(51) Int. Cl.
*H01L 51/56* (2006.01)
*H01L 51/00* (2006.01)

(52) U.S. Cl.
CPC ...... *H01L 51/5206* (2013.01); *H01L 51/5221* (2013.01); *H01L 51/56* (2013.01); *H01L 2227/323* (2013.01); *H01L 2251/301* (2013.01); *H01L 2251/303* (2013.01); *H01L 2251/5338* (2013.01); *H01L 2251/558* (2013.01)

(58) Field of Classification Search
CPC ............. H01L 27/3258; H01L 51/0097; H01L 2251/5338; H01L 2251/301; H01L 51/5256; H01L 27/3262; H01L 51/5206; H01L 51/5221; H01L 2251/558; H01L 2227/323; H01L 2251/303; H01L 21/02672; H01L 29/7869; H01L 29/458; H01L 29/4908; H01L 29/66765
See application file for complete search history.

(56) References Cited

U.S. PATENT DOCUMENTS

| | | | |
|---|---|---|---|
| 2018/0151834 A1* | 5/2018 | Kanaya | H01L 51/5234 |
| 2018/0151837 A1* | 5/2018 | Furuie | H01L 51/5253 |

* cited by examiner

1000

ORGANIC LIGHT-EMITTING DISPLAY PANEL, METHOD FOR MANUFACTURING ORGANIC LIGHT-EMITTING DISPLAY PANEL AND ORGANIC LIGHT-EMITTING DISPLAY DEVICE

CROSS-REFERENCE TO RELATED APPLICATIONS

The present application claims priority to Chinese Patent Application No. 201810291621.8, filed on Mar. 30, 2018, the content of which is incorporated herein by reference in its entirety.

TECHNICAL FIELD

The present disclosure relates to the technical field of organic light-emitting display technologies and, particularly, relates to an organic light-emitting display panel, a method for manufacturing the organic light-emitting display panel, and an organic light-emitting display device.

BACKGROUND

With the development of display technologies, a portable device has become a new development trend in modern society and is gradually changing human's life, bringing about significant revolution for science and technology. In particular, an organic light-emitting display device as a self-luminous display device does not require a separate light source. Therefore, the organic light-emitting display device can operate at a low voltage, be lightweight and thin, and provide high quality characteristics such as a wide viewing angle, high contrast, and fast response. Therefore, the organic light-emitting display device as a next-generation display device have arisen the attention of people.

In order to further improve visual experience, full-screen display has been pursued by people. However, there are still some technologies to be developed and improved about how to achieve the full-screen display on an organic light-emitting display panel.

SUMMARY

The present disclosure provides an organic light-emitting display panel, a method for manufacturing the organic light-emitting display panel, and an organic light-emitting display device, which can solve the above-mentioned problems.

In one embodiment, an organic light-emitting display panel is provided. The organic light-emitting display panel includes: a flexible substrate comprising a display region, an aperture region surrounded by the display region, and a first non-display region located between the display region and the aperture region; a thin film transistor layer arranged on the flexible substrate; a light-emitting device layer arranged on a side of the thin film transistor layer facing away from the flexible substrate, and the light-emitting device layer comprises a first electrode, a light-emitting layer, and a second electrode; an encapsulation layer arranged on a side of the light-emitting device layer facing away from the flexible substrate, and the encapsulation layer sequentially comprises a first inorganic encapsulation layer and a first organic encapsulation layer on the side of the light-emitting device layer along a direction facing away from the flexible substrate, and borders of the second electrode and the first inorganic encapsulation layer in the first non-display region are aligned; and an inorganic layer, and the inorganic layer covers the borders of the second electrode and the first inorganic encapsulation layer in the first non-display region.

In another embodiment, a method for manufacturing an organic light-emitting display panel is provided. The method includes providing a flexible substrate, and the flexible substrate comprises a display region, a preset aperture forming region, and a first non-display region located between the display region and the preset aperture forming region; manufacturing a thin film transistor layer on the flexible substrate, manufacturing a light-emitting device layer on the thin film transistor layer, and manufacturing the light-emitting device layer comprises sequentially manufacturing a first electrode, a light-emitting layer, and a second electrode on a side of the thin film transistor layer facing away from the flexible substrate by evaporation; manufacturing an encapsulation layer on the light-emitting device layer, and manufacturing the encapsulation layer comprises manufacturing a first inorganic encapsulation layer, and further comprises a dry-etching step so that borders of the first inorganic encapsulation layer and the second electrode in the first non-display region are aligned; manufacturing an inorganic layer, and the inorganic layer covers the borders of the first inorganic encapsulation layer and the second electrode in the first non-display region; and cutting the preset aperture forming region to form an aperture region in the flexible substrate.

In yet another embodiment, an organic light-emitting display device is provided. The organic light-emitting display device includes an organic light-emitting display panel, and the organic light-emitting display panel includes a flexible substrate comprising a display region, an aperture region surrounded by the display region, and a first non-display region located between the display region and the aperture region, a thin film transistor layer arranged on the flexible substrate, a light-emitting device layer arranged on a side of the thin film transistor layer facing away from the flexible substrate, and the light-emitting device layer comprises a first electrode, a light-emitting layer, and a second electrode, an encapsulation layer arranged on a side of the light-emitting device layer facing away from the flexible substrate, and the encapsulation layer sequentially comprises a first inorganic encapsulation layer and a first organic encapsulation layer on the side of the light-emitting device layer along a direction facing away from the flexible substrate, and borders of the second electrode and the first inorganic encapsulation layer in the first non-display region are aligned, and an inorganic layer, and the inorganic layer covers the borders of the second electrode and the first inorganic encapsulation layer in the first non-display region.

BRIEF DESCRIPTION OF DRAWINGS

The accompanying drawings, which are incorporated into and constitute a part of this specification, illustrate embodiments of the present disclosure and, together with the description thereof, serve to explain the principles of the present disclosure.

DESCRIPTION OF EMBODIMENTS

The expressions describing the position and direction in the present disclosure are illustrated with reference to the drawings. The drawings of the present disclosure are only used for illustrating the relative position relationship, and the layer thickness of some parts is shown in a exaggerating drawing manner for ease of understanding and does not represent a proportional relationship of the actual layer thicknesses.

It should be noted that specific details are set forth in the following description in order to fully understand the present disclosure. However, the present disclosure can be implemented in a variety of other manners different from those described herein. This description and the claims do not use the differences in names as a way of distinguishing the components, but use the differences in the functions of the components as a principle for distinguishing the components. As used throughout the description and claims, the expression "including" is an open language and it should be interpreted as "including but not limited to." Embodiments for implementing the present disclosure are described in the subsequent description, however, the description is intended to illustrate general principles of the present disclosure and is not intended to limit the scope of the present disclosure. The protection scope of the present disclosure is defined by the appended claims.

Figure 1:
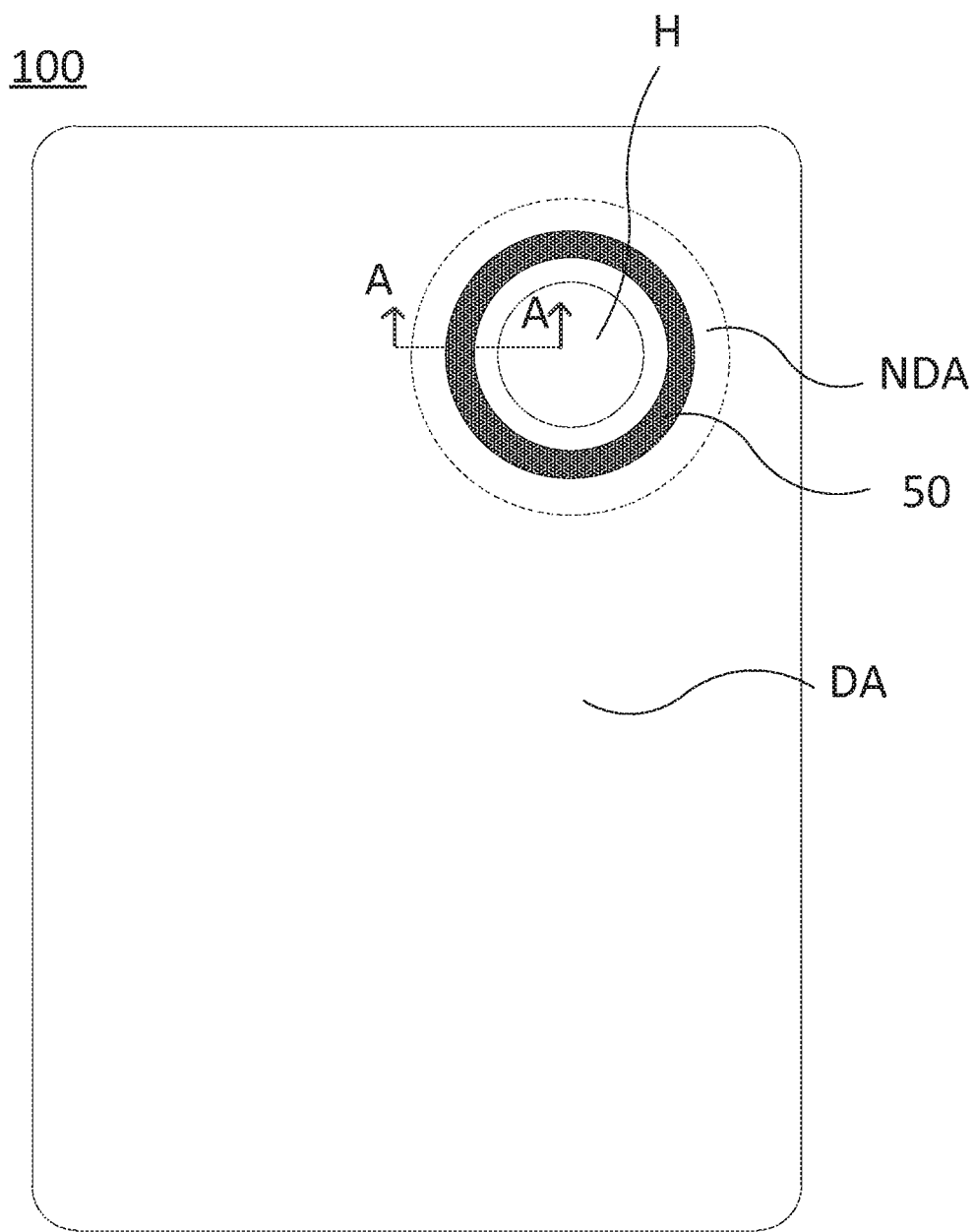
FIG. 1 is a front view of an organic light-emitting display panel according to an embodiment of the present disclosure.
Figure 2:
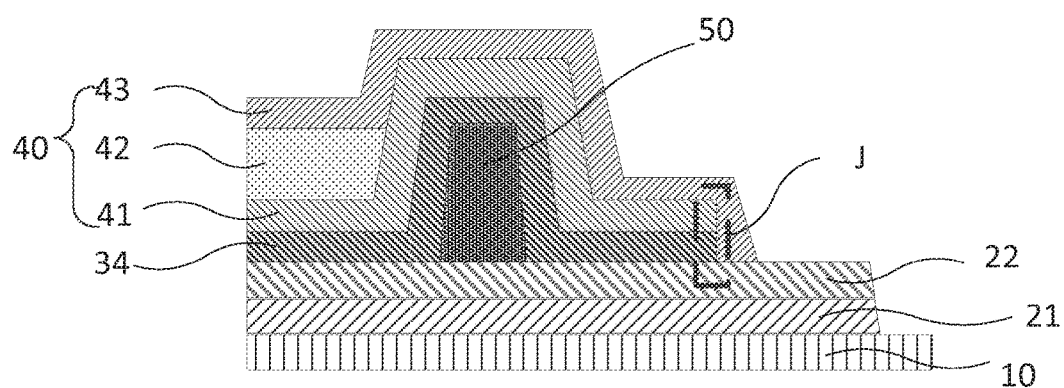
FIG. 2 is a structural schematic diagram showing a cross section A-A of a first non-display region according to an embodiment of the present disclosure.
Figure 3:
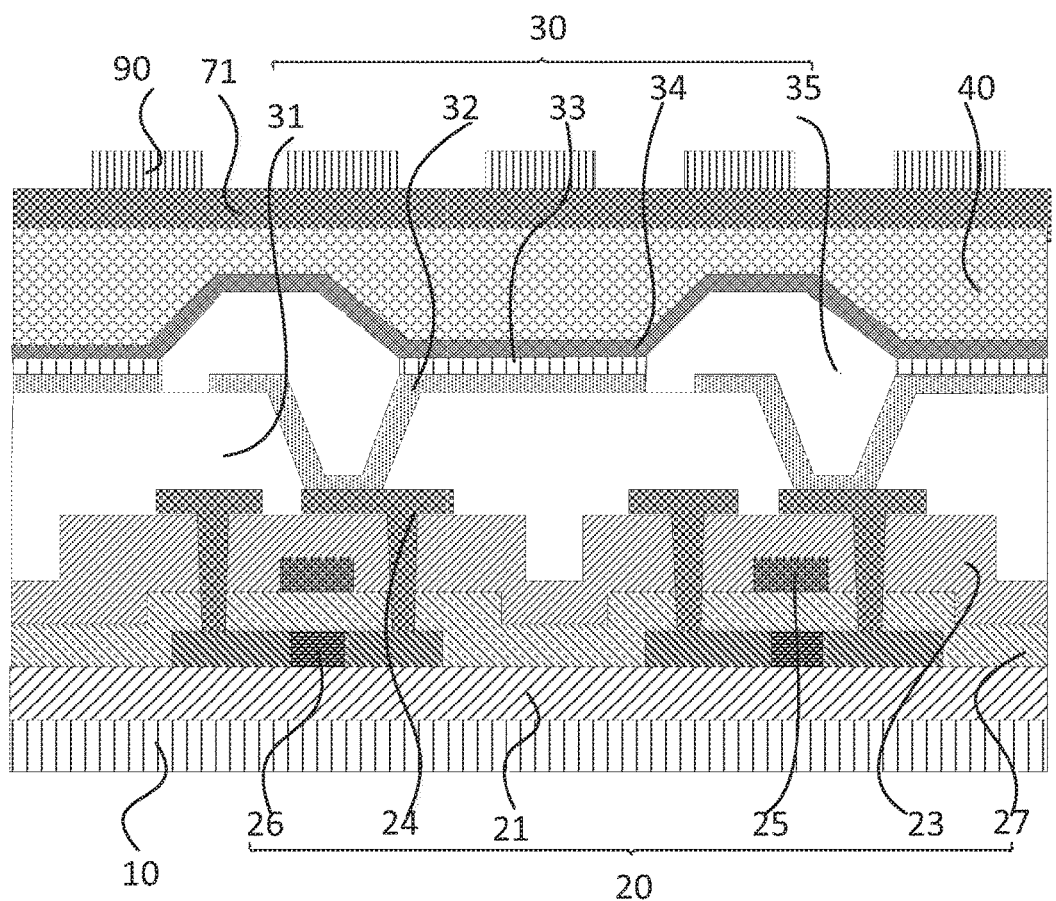
FIG. 3 is a partial structural schematic diagram of a display region of an organic light-emitting display panel according to an embodiment of the present disclosure.
Figure 4:
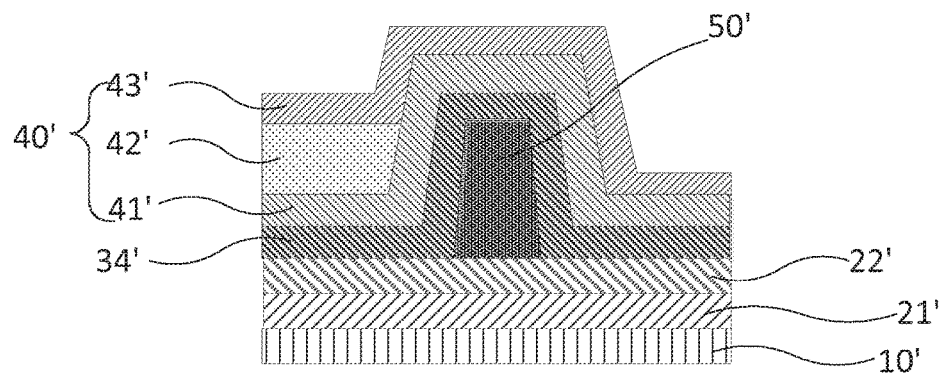
FIG. 4 is a structural schematic diagram showing a comparison example of a cross section A-A of a first non-display region according to an embodiment of the present disclosure.

FIG. 1 is a front view of an organic light-emitting display panel according to an embodiment of the present disclosure; FIG. 2 is a structural schematic diagram showing a cross section A-A of a first non-display region according to an embodiment of the present disclosure; and FIG. 3 is a partial structural schematic diagram of a display region of an organic light-emitting display panel according to an embodiment of the present disclosure. As shown in FIGS. 1-3, the organic light-emitting display panel includes a flexible substrate 10, and the flexible substrate 10 includes a display region DA and an aperture region H surrounded by the display region DA. The flexible substrate 10 further includes a first non-display region NDA located between the display region DA and the aperture region H. The organic light-emitting display panel further includes: a thin film transistor layer 20 arranged on the flexible substrate 10; a light-emitting device layer 30 arranged on a side of the thin film transistor layer 20 facing away from the flexible substrate 10, and an encapsulation layer 40 arranged on a side of the light-emitting device layer 30 facing away from the flexible substrate 10. The light-emitting device layer 30 includes a first electrode 32, a light-emitting layer 33, and a second electrode 34. The encapsulation layer 40 sequentially includes a first inorganic encapsulation layer 41 and a first organic encapsulation layer 42 on the side of the light-emitting device layer 30 along a direction away from the flexible substrate 10, and borders J of the second electrode 34 and the first inorganic encapsulation layer 41 in the first non-display region are aligned. The flexible substrate 10 further includes an inorganic layer 43 or 71. The inorganic layer 43 or 71 covers the borders J of the second electrode 34 and the first inorganic encapsulation layer 41 in the first non-display region. An embodiment of the present disclosure provides an organic light-emitting display panel having an aperture region H, and the display region DA surrounds the aperture region H, and components such as a camera and the like may be placed in the aperture region H so that no additional frame is required to place the camera, thereby realizing a full-screen display. On the contrary, FIG. 4 is a structural schematic diagram showing a comparison example of a cross section A-A of a first non-display region according to an embodiment of the present disclosure. As shown in FIG. 4, some film layers of the organic light-emitting display panel, such as the second electrode 34', are formed by a Com mask having a hollow area and a frame surrounding the hollow area, a film (e.g., the second electrode 34') being only deposited in the hollow area. During manufacturing of the organic light-emitting display panel, the display region and the aperture region are both located in an opening region of a mask so that the second electrode 34' is also deposited in the aperture region. When the aperture region is formed by cutting, the border of the second electrode 34' is exposed to form a path for moisture and oxygen, which affects service life of the light-emitting device layer. In severe cases, the light-emitting device layer may not work normally. However, even if manufacturing the second electrode 34' is completed and then etched so that the border of the second electrode 34' is covered by the first inorganic encapsulation layer, preventing moisture and oxygen from permeating along the border of the second electrode 34', then the etching of the second electrode 34' requires the use of a photoresist, the removal of the photoresist needs to be done in a moisture environment, and moisture and oxygen may still damage the light-emitting device layer, thus affecting the service life of the light-emitting device layer. In the embodiment of the present disclosure, the borders of the second electrode 34 and the first inorganic encapsulation layer 41 in the first non-display region NDA are aligned, and then the inorganic layer covers the borders of the second electrode 34 and the first inorganic encapsulation layer 41 in the first non-display region, so that the second electrode 34 is wrapped by the inorganic layer, and since the inorganic layer has a denser structure and has a favorable effect of blocking moisture and oxygen, the service life of the device of the light-emitting device layer can be greatly improved.

In some embodiments, continuing to refer to FIG. 3, the light-emitting device layer 30 further includes a planarization layer 31, and a pixel definition layer 35 located between the light-emitting layer 33. The pixel definition layer 35 includes a plurality of pixel definition portions, and the light-emitting layer 33 includes a plurality of light-emitting portions located between the plurality of pixel definition portions. In the light-emitting device layer 30, the first electrode 32 generates holes (or electrons) and the second electrode 34 generates electrons (or holes), and the holes (or electrons) and the electrons (or holes) are injected into the light-emitting layer 33. The injected electrons and holes combine with each other to form excitons. The light-emitting device layer 30 emits light by the energy generated when the excitons fall from an excited state to a ground state. The light-emitting device layer 30 may further include one or more layers selected from a group consisting of a hole injection layer, a hole transportation layer, an electron blocking layer, a hole blocking layer, an electron transportation layer, and an electron injection layer. The light-emitting portion may be a red light-emitting portion, a green light-emitting portion, or a blue light-emitting portion. The light-emitting layer 33 may be a single white light-emitting layer. Or, the light-emitting layer 33 may have a stacked structure of the red light-emitting layer, the green light-emitting layer, and/or the blue light-emitting layer. The light-emitting layer 33 may include a color filter (not shown in the figures) if the light-emitting layer 33 has the stacked structure. In the embodiments of the present disclosure, one of the first electrode 32 and the second electrode 34 is an anode, and the other one of the first electrode 32 and the second electrode 34 is a cathode, which is not limited in the present disclosure. The hole injection layer and/or the hole transportation layer may be arranged between the anode and the light-emitting layer, and the electron injection layer and/or the electron transportation layer may be arranged between the cathode and the light-emitting layer. When the light-emitting device layer 30 includes one or more layers selected from a group consisting of a hole injection layer, a hole transportation layer, an electron blocking layer, a hole blocking layer, an electron transportation layer, and an electron injection layer, the one or more layers selected from the group of the hole injection layer, the hole transportation layer, the electron blocking layer, the hole blocking layer, the electron transportation layer, and the electron injection layer may be etched together with the second electrode 34, and the edge or edges of the one or more layers and the edge of the second electrode 34 are aligned.

In some embodiments, the encapsulation layer 40 includes a second inorganic encapsulation layer 43 arranged on a side of the first organic encapsulation layer 42 facing away from the flexible substrate 10, and the inorganic layer is the second inorganic encapsulation layer 43. By adopting the second inorganic encapsulation layer as the inorganic layer to cover the borders of the first inorganic encapsulation layer and the second electrode in the first non-display region NDA, the manufacturing process can be saved, and on the other hand, the encapsulation effect can be enhanced. In some embodiments, the material of the first organic encapsulation layer 42 may include a polymer, for example, the first organic encapsulation layer 42 may be a single layer or a stacked layer made of at least one of polyethylene terephthalate, polyimide, polycarbonate, epoxy resin, polyethylene, polyacrylate, or organosiloxane. The first inorganic encapsulation layer may be a single layer or a stacked layer including a metal oxide or a metal nitride.

Figure 5:
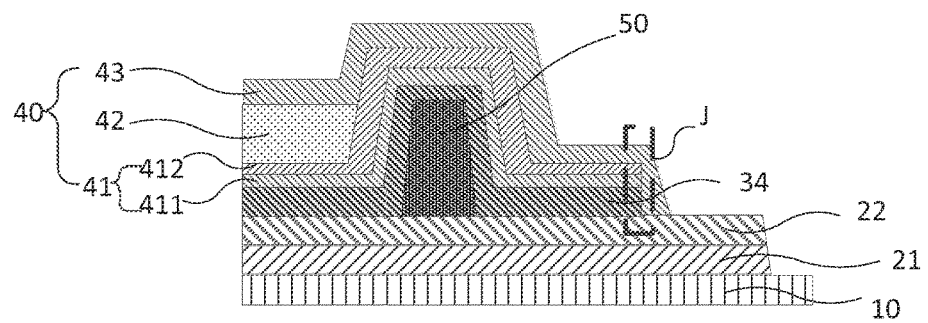
FIG. 5 is a structural schematic diagram showing a cross section A-A of another first non-display region according to an embodiment of the present disclosure.

FIG. 5 is a structural schematic diagram showing a cross section A-A of another first non-display region according to an embodiment of the present disclosure. The embodiment shown in FIG. 5 differs from the foregoing embodiment in that the first inorganic encapsulation layer 41 sequentially includes a first inorganic encapsulation sub-layer 411 and a second inorganic encapsulation sub-layer 412 along the direction away from the flexible substrate 10, and an etch rate of the second inorganic encapsulation sub-layer 412 is smaller than that of the first inorganic encapsulation sub-layer 411. In the present embodiment, by setting that the first inorganic encapsulation layer 41 include the first inorganic encapsulation sub-layer 411 and the second inorganic encapsulation sub-layer 412 and the etch rate of the second inorganic encapsulation sub-layer 412 is smaller than that of the first inorganic encapsulation sub-layer 411, after manufacturing of the second inorganic encapsulation sub-layer 412 is completed, the second inorganic encapsulation sub-layer 412 may be firstly etched with a manner of dry-etching and then the photoresist on the second inorganic encapsulation sub-layer 412 is removed, therefore, even though moisture exists upon removing the photoresist, the second electrode 34 is still covered and protected by the first inorganic encapsulation sub-layer 411 and isolated from the moisture. Then, the first inorganic encapsulation sub-layer 411 and the second electrode 34 are etched by taking the second inorganic encapsulation sub-layer 412 as a mask. Since the first inorganic encapsulation sub-layer 411 and the second electrode 34 are etched by taking the second inorganic encapsulation sub-layer 412 as a mask for shielding, it is not required to additionally purchase a mask, which saves cost, and it is not required to additionally coat the photoresist and then a process of removing the photoresist does not exist, so that the first inorganic encapsulation sub-layer 411 and the second electrode 34 are etched in an anhydrous and oxygen-free environment, and moisture and oxygen do not easily permeate into the light-emitting device layer, thus the light-emitting device layer 30 will not be damaged.

In some embodiments, a ratio of the etch rate of the second inorganic encapsulation sub-layer 412 to the etch rate of the first inorganic encapsulation sub-layer 411 is smaller than 1:2. When the ratio of the etch rate of the second inorganic encapsulation sub-layer 412 to the etch rate of the first inorganic encapsulation sub-layer 411 is too large, the second inorganic encapsulation sub-layer 412 may be etched off together with the first inorganic encapsulation sub-layer 411 when the second inorganic encapsulation sub-layer 412 is used as a mask to etch the first inorganic encapsulation sub-layer 411, causing that the borders of the first inorganic encapsulation sub-layer 411 and the second electrode 34 is not controllable. In severe cases, the first inorganic encapsulation sub-layer 411 and the second inorganic encapsulation sub-layer 412 may be over-etched, so that it may not satisfy the effect of encapsulating the light-emitting device layer.

In some embodiments, a material of the second inorganic encapsulation sub-layer 412 may include aluminum oxide or iron oxide, and a material of the first inorganic encapsulation sub-layer 411 may include at least one of silicon nitride, silicon oxide, or silicon oxynitride.

In some embodiments, the second inorganic encapsulation sub-layer 412 has a thickness of 30 nm to 300 nm, and the first inorganic encapsulation sub-layer 411 has a thickness of 0.5 μm to 2 μm.

In some embodiments, the second inorganic encapsulation sub-layer 412 may be manufactured with a manner of atomic layer deposition, and the first inorganic encapsulation sub-layer 411 may be manufactured with a manner of chemical vapor deposition.

In an embodiment of the present disclosure, a first inorganic encapsulation sub-layer 411 having a thickness of 0.5 μm to 2 μm is manufactured with a manner of chemical vapor deposition, and then a second inorganic encapsulation sub-layer 412 having a thickness of 30 nm to 300 nm is manufactured with a manner of atomic layer deposition. The material of the second inorganic encapsulation sub-layer 412 may be aluminum oxide or iron oxide, and the material of the first inorganic encapsulation sub-layer 411 may be at least one of silicon nitride, silicon oxide, or silicon oxynitride. Since there may be particles present in the manufacturing process before the encapsulation layer is manufactured, the used first inorganic encapsulation layer which has a thickness of 0.5 μm to 2 μm and is made of silicon nitride, silicon oxide, or silicon oxynitride has a good coverage for the particles, prevents the first inorganic encapsulation sub-layer 411 from being broken and affecting its encapsulation effect due to presence of the particles. In addition, since alumina oxide or iron oxide has a relatively dense structure and has a good effect of water blocking and oxygen blocking, then when the second inorganic encapsulation sub-layer 411 is manufactured with a manner of atomic layer deposition, the thickness may be 30 to 300 nm, thus obtaining a small thickness and a small etching rate. Therefore, it is possible to enhance the encapsulation effect at the same time, and the second inorganic encapsulation sub-layer 412 is not easy to be scratched by the particles and serves as a mask for the first inorganic encapsulation sub-layer 411 and the second electrode 34. It can also prevent the moisture and oxygen from permeating into the light-emitting device layer when the photoresist is removed during the dry-etching process, and prevent the service life of the organic light-emitting display panel from being adversely effected.

Figure 6:
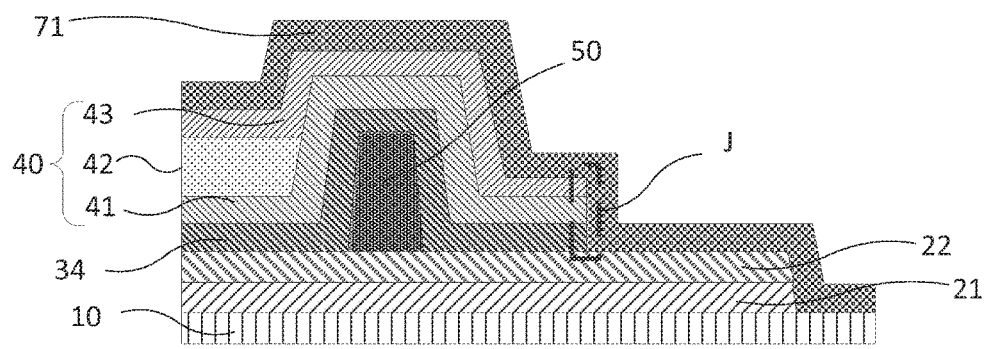
FIG. 6 is a structural schematic diagram showing a cross section A-A of another first non-display region according to an embodiment of the present disclosure.

FIG. 6 is a structural schematic diagram showing a cross section A-A of another first non-display region according to an embodiment of the present disclosure. As shown in FIG. 6, a second inorganic encapsulation layer 43 is arranged on a side of the first organic encapsulation layer 41 facing away from the flexible substrate 10, borders J of the second inorganic encapsulation layer 43, the second electrode 34, and the first inorganic encapsulation layer 41 in the first non-display region NDA are aligned, and the inorganic layer 71 is arranged on a side of the second inorganic encapsulation layer 43 facing away from the flexible substrate 10. Meanwhile, the inorganic layer 71 covers the borders J of the second inorganic encapsulation layer 43, the second electrode 34 and the first inorganic encapsulation layer 41 in the first non-display region NDA. In the embodiment of the present disclosure, after the second inorganic encapsulation layer 43 is formed, the second electrode 34, the first inorganic encapsulation layer 41 and the second inorganic encapsulation layer 43 are firstly etched, so that the borders J of the second inorganic encapsulation layer 43, the second electrode 34, and the first inorganic encapsulation layer 41 in the first non-display region NDA are aligned, and then the borders J of the second inorganic encapsulation layer 43, the second electrode 34 and the first inorganic encapsulation layer 41 in the first non-display region NDA are covered by the inorganic layer 71. Therefore, the second electrode is wrapped by the inorganic layer, and the moisture and oxygen are blocked, thus improving the service life of the light-emitting device layer.

In some embodiments, the etch rate of the second inorganic encapsulation layer 43 is smaller than the etch rate of the first inorganic encapsulation layer 41, so that the second inorganic encapsulation layer 43 may be etched with a manner of dry-etching. Upon removing the photoresist, the first inorganic encapsulation layer 41 and the second electrode 34 are etched by taking the second inorganic encapsulation layer 43 as a mask, so that borders J of the second inorganic encapsulation layer 43, the second electrode 34 and the first inorganic encapsulation layer 41 in the first non-display region NDA are aligned, and subsequently, the inorganic layer is formed to cover the borders J of the second inorganic encapsulation layer 43, the second electrode 34 and the first inorganic encapsulation layer 41 in the first non-display region NDA. This can prevent the moisture from causing erosion to the light-emitting device layer 30 and affecting performances of the light-emitting device layer when the second electrode 34 is etched. And it is not required to add additional masks, thus saving costs.

In some embodiments, a ratio of the etch rate of the second inorganic encapsulation layer 43 to the etch rate of the first inorganic encapsulation layer 41 is smaller than 1:2.

In some embodiments, a material of the second inorganic encapsulation layer 43 includes aluminum oxide or iron oxide, and a material of the first inorganic encapsulation layer 41 includes silicon nitride, silicon oxide, or silicon oxynitride.

In some embodiments, the second inorganic encapsulation layer 43 has a thickness of 30 nm to 300 nm, and the first inorganic encapsulation layer 41 has a thickness of 0.5 μm to 2 μm.

In some embodiments, the second inorganic encapsulation layer 43 is manufactured with a manner of atomic layer deposition, and the first inorganic encapsulation layer 41 is manufactured with a manner of chemical vapor deposition. In the embodiments of the present disclosure, the first inorganic encapsulation layer is manufactured to be a layer of silicon nitride, silicon oxide, or silicon oxynitride having a thickness of 0.5 μm to 2 μm, and can effectively cover the particles generated in the previous manufacturing process, therefore, the phenomenon of film breakage will not easily occur. In addition, when a layer of alumina oxide or iron oxide having a thickness of 30 nm to 300 nm is manufactured with a manner of the atomic layer deposition, since the film layer manufactured with a manner of the atomic layer deposition is dense and thin, the encapsulation effect can be further enhanced. Since the layer of alumina oxide or iron oxide is the second inorganic encapsulation layer, even if particles are present on a surface of the second inorganic encapsulation layer when the light-emitting device layer is manufactured, the particles will be covered by the first inorganic encapsulation layer and the first organic encapsulation layer, thus a phenomenon of film breakage will not occur. In addition, no additional inorganic layer is required to cover the edges of the inorganic encapsulation layer 41 and the second electrode in the first non-display region NDA, thus saving the manufacturing process.

It should be noted that etch rate setting, material selection, thickness setting, and manufacturing process selection of the first inorganic encapsulation layer 41 and the second inorganic encapsulation layer 43 may achieve the same technical effect as that of the first inorganic encapsulation sub-layer and the second inorganic encapsulation sub-layer, which will not be elaborated herein.

Figure 7:
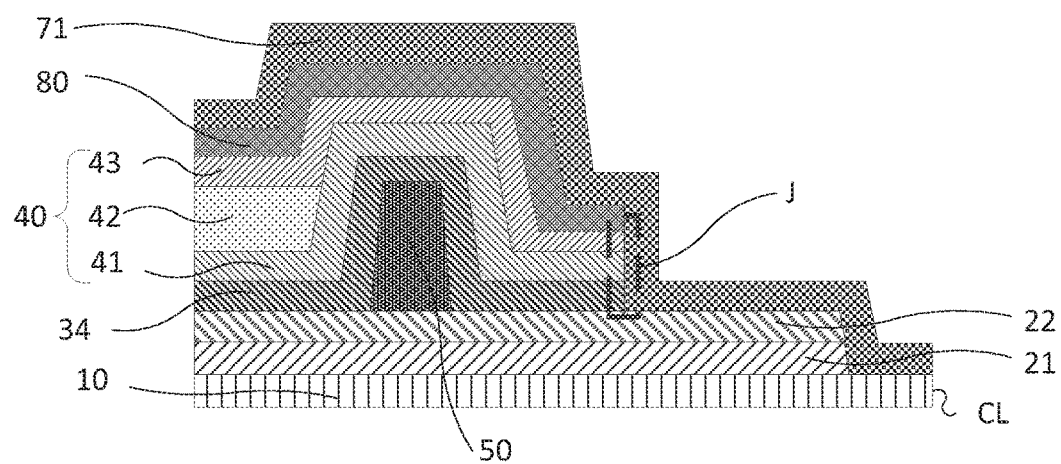
FIG. 7 is a structural schematic diagram showing a cross section A-A of still another first non-display region according to an embodiment of the present disclosure.

FIG. 7 is a structural schematic diagram showing a cross section A-A of another first non-display region according to an embodiment of the present disclosure. The embodiment shown in FIG. 7 differs from the above embodiments in that a second organic layer 80 is arranged between the second inorganic encapsulation layer 43 and the inorganic layer 71. In an embodiment, after manufacturing of the second inorganic encapsulation layer 43 is completed, a photoresist is coated on the second inorganic encapsulation layer 43 to etch the second inorganic encapsulation layer 43, the first inorganic encapsulation layer 41 and the second electrode 34 so that borders J of the second inorganic encapsulation layer 43, the first inorganic encapsulation layer 41 and the second electrode 34 in the first non-display region NDA are aligned. The photoresist is not removed and serves as the second inorganic layer, and then the inorganic layer 71 is manufactured on the second inorganic layer 80 so that the inorganic layer 71 covers the second inorganic encapsulation layer 43, the first inorganic encapsulation layer 41, and the second electrode 34. Therefore, the second electrode is in an environment sealed by the inorganic layer, and the moisture and oxygen may not enter into the light-emitting device layer, preventing the moisture and oxygen from causing erosion to the light-emitting device layer.

In some embodiments, continuing to refer to FIG. 3, a touch layer 90 is arranged on a side of the inorganic layer 71 facing away from the flexible substrate 10. However, since the thin-film transistor layer 20 is further arranged on the flexible substrate, and the thin-film transistor layer 20 may sequentially include, in a stacked manner, a semiconductor layer 26, a gate insulation layer 27, a gate layer 25, an interlayer insulation layer 23, and a source-drain metal layer 24 and traces such as data lines, scan lines and the like manufactured in a same layer as the source/drain electrodes, when there is a short distance between the touch layer and the source/drain electrodes or other traces, parasitic capacitance will be generated there between, affecting each other's signal transmission. In the embodiment of the present disclosure, by using the photoresist remained after etching of the second inorganic encapsulation layer is completed as the second inorganic layer, the parasitic capacitance between the touch layer and the source/drain electrodes or other traces can be reduced, thus improving the touch sensitivity. In some embodiments, the touch layer 90 may include a touch electrode and a touch trace, and the touch electrode may be a self-capacitance touch electrode or a mutual-capacitance touch electrode. The self-capacitance touch electrode may be a block-like electrode or a strip-like electrode. The mutual-capacitance touch electrode may include a plurality of first touch electrodes and a plurality of second touch electrodes. The plurality of first touch electrodes and the plurality of second touch electrodes can be strip-like electrodes, and the plurality of first touch electrodes are arranged in different layer from the plurality of second touch electrodes, and are insulated from and intersect with the plurality of second touch electrodes. Or, the plurality of first touch electrodes and the plurality of second touch electrodes are block-like electrodes which are arranged in a same layer, the plurality of first touch electrodes is bridged electrically to each other, and the plurality of second touch electrodes is bridged electrically to each other. The touch electrodes are not limited by the embodiments of the present disclosure.

In some embodiments, the thin film transistor layer 20 further includes a buffer layer 21 and an insulation layer 22 sequentially arranged on the flexible substrate 10. The organic light-emitting display panel includes a cutting edge, e.g. CL as shown in FIG. 7. The cutting edge CL does not have any insulation layer 22 or does not have any insulation layer 22 and any buffer layer 21. The insulation layer 22 may include at least one layer of the gate insulation layer 27 or the interlayer insulation layer 23. In some embodiments, the materials of the buffer layer 21 and the interlayer insulation layer 22 include silicon oxide, silicon nitride, or the like. The buffer layer 71 provides a flat surface for forming the thin film transistor layer 20. In the embodiments of the present disclosure, the first non-display region NDA may be provided with the buffer layer 21 and the insulation layer 22 so that the first inorganic encapsulation layer 41 and/or the second inorganic encapsulation layer 43 of the encapsulation layer contact with at least one layer of the buffer layer 21 or the insulation layer 22. Since the contact is a contact between the inorganic layers, there is a favorable contact interface so that the second electrode 34 and other film layers in the light-emitting device layer 30 are all sealed by the inorganic layer and the external moisture and are isolated from external moisture and oxygen, thus having good encapsulation effect. However, since no buffer layer 21 and/or insulation layer 22 is arranged at the cutting edge CL, it can prevent a crack from growing along the buffer layer 21 or the insulation layer 22 when cutting, thereby preventing the moisture from permeating into the light-emitting device layer 30 along the crack. It should be noted that in other embodiments, the thin film transistor layer 20 may be a bottom gate structure, which is not limited in the embodiments of the present disclosure.

In any of the above embodiments, the first non-display region NDA may be provided with a first barrier wall 50, and the second electrode 34 and the first inorganic encapsulation layer 41 cover the first barrier wall 50. In the embodiments of the present disclosure, when the first organic encapsulation layer is manufactured by inkjet printing, by arranging the first barrier wall 50 in the first non-display region NDA, the first barrier wall 50 can effectively define the border of the first non-display region, preventing the first organic encapsulation layer from overflowing to the first non-display region NDA. In addition, the material of the first barrier wall 50 may be organic, and the arrangement that the second electrode 34 and the first inorganic encapsulation layer 41 cover the first barrier wall 50 can prevent the first barrier wall 50 from being exposed to the air to form a path of moisture and oxygen, also, the borders of the second electrode 34 and the first inorganic encapsulation layer 41 are covered by the inorganic layer so that the first barrier wall 50 is also in an environment sealed by the inorganic layer, and the moisture and oxygen are blocked, thus improving the effect of blocking the moisture and oxygen for the side surface of the organic light-emitting display panel. In some other embodiments, a plurality of first barrier walls may be provided.

Figure 8:
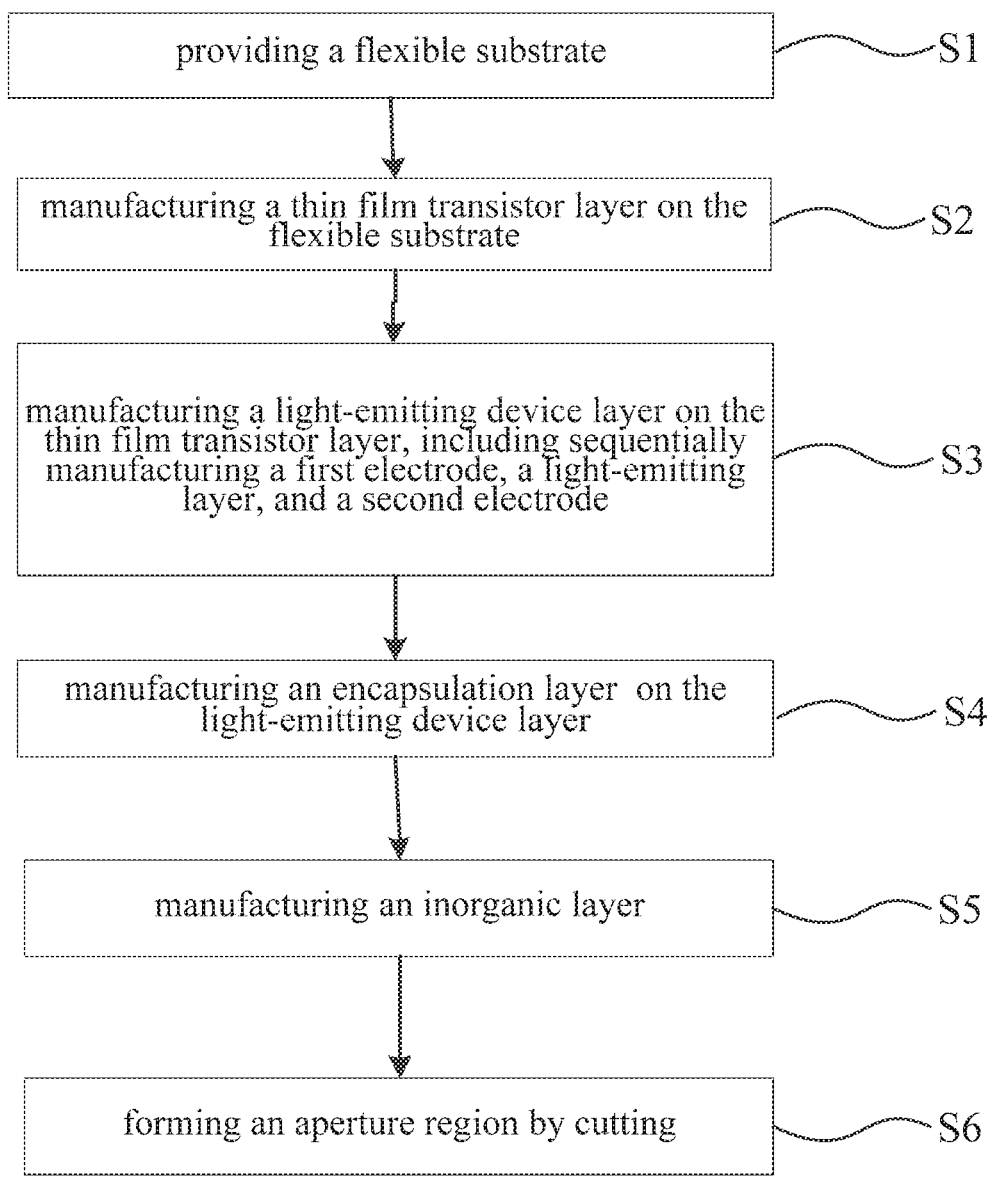
FIG. 8 is a flowchart showing a method for manufacturing an organic light-emitting display panel according to an embodiment of the present disclosure.

FIG. 8 is a flowchart showing a method for manufacturing an organic light-emitting display panel according to an embodiment of the present disclosure. Referring to FIG. 8, the method for manufacturing the organic light-emitting display panel provided by the embodiment of the present disclosure includes the following steps.

Figure 12:
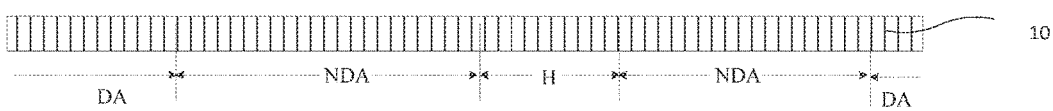
FIG. 12 is a partial cross sectional diagram of a flexible substrate according to an embodiment of the present disclosure.

At step S1, a flexible substrate 10 is provided, the flexible substrate 10 includes a display region DA, a preset aperture forming region H, and a first non-display region NDA located between the display region DA and the preset aperture forming region H; and FIG. 12 shows a partial structural schematic diagram of a cross section of the flexible substrate according to the embodiments of the present disclosure.

Figure 13:
FIG. 13 is a partial structural schematic diagram of a cross section of film layers after step S2.

At step S2, a thin film transistor layer 20 is manufactured on the flexible substrate 10, as shown in FIG. 13. It should be noted that only the buffer layer 21 in the thin film transistor layer is illustrated in FIG. 13, and other layer structures can be referred to from FIG. 3.

Figure 14:
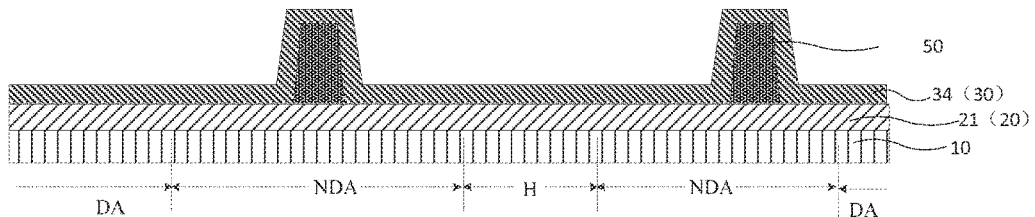
FIG. 14 is a partial structural schematic diagram of a cross section of film layers after step S3.

At step S3, a light-emitting device layer 30 is manufactured on the thin film transistor layer 20. Manufacturing the light-emitting device layer 30 includes sequentially manufacturing a first electrode 32, a light-emitting layer 33, and a second electrode 34 on a side of the thin film transistor layer 20 facing away from the flexible substrate 10 with a manner of evaporation, as shown in FIG. 14. The other film layer structures in the light-emitting device layer 30 can be referred to from FIG. 3.

Figure 9:
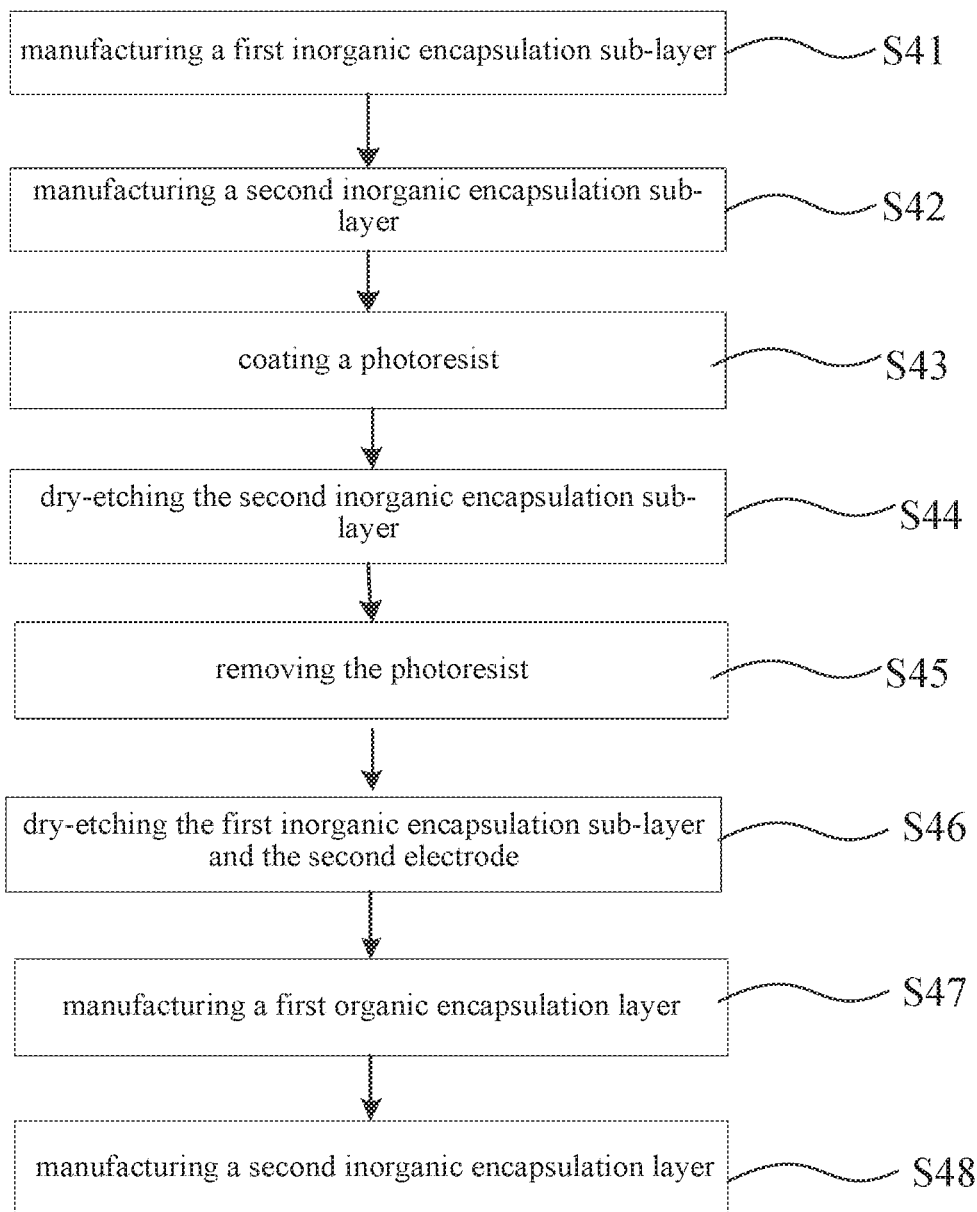
FIG. 9 is a flowchart showing step S4 according to an embodiment of the present disclosure.
Figure 15:
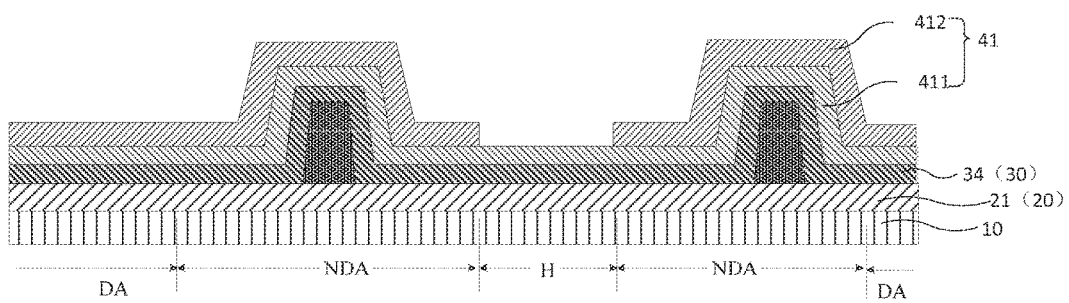
FIG. 15 is a partial structural schematic diagram of a cross section of film layers after a second inorganic encapsulation sub-layer is dry-etched.

At step S4, an encapsulation layer 40 is manufactured on the light-emitting device layer 30. Manufacturing the encapsulation layer 40 includes manufacturing a first inorganic encapsulation layer 41, and further includes a dry-etching step, upon which the borders of the first inorganic encapsulation layer 41 and the second electrode 34 in the first non-display region are aligned. Referring to FIG. 9 and FIG. 15. FIG. 9 is a flowchart of step S4 according to an embodiment of the present disclosure; and FIG. 15 is a partial structural schematic diagram of a cross section of film layers after a second inorganic encapsulation sub-layer is dry-etched. Step S4 may include the following steps:

S41: manufacturing a first inorganic encapsulation sub-layer 411:

S42: manufacturing a second inorganic encapsulation sub-layer 412;

S43: coating a photoresist;

S44: dry-etching the second inorganic encapsulation sub-layer 412:

S45: removing the photoresist;

S46: dry-etching the first inorganic encapsulation sub-layer 412 and the second electrode 34:

S47: manufacturing a first organic encapsulation layer 42; and

S48: manufacturing a second inorganic encapsulation layer 43.

AT step S5, an inorganic layer is manufactured so that the inorganic layer covers the borders J of the first inorganic encapsulation layer 41 and the second electrode 34 in the first non-display region NDA.

At step S6, the preset aperture forming region is cut so as to form an aperture region H in the flexible substrate 10.

Since moisture exists when the photoresist is removed during the dry-etching, if the first inorganic encapsulation layer and the second electrode are directly dry-etched, then the photoresist is removed, and a second inorganic encapsulation layer is manufactured to cover borders of the first inorganic encapsulation layer and the second electrode in the first non-display region, then the moisture would erode the second electrode from the borders and permeate into the light-emitting device layer during removing of the photoresist, which affects the service life of the light-emitting device layer. In the embodiment of the present disclosure shown in FIG. 15, the second inorganic encapsulation sub-layer 412 is dry-etched by firstly applying a photoresist, then the photoresist is removed, and then the second inorganic encapsulation sub-layer is used as a mask to etch the first inorganic encapsulation sub-layer 411 and the second electrode 34, so that the photoresist is not required to be coated when the first inorganic encapsulation sub-layer 411 and the second electrode 34 are dry-etched, and thus the step of removing the photoresist is not required any more. Therefore, during the whole dry-etching process, the second electrode is all covered by the first inorganic encapsulation sub-layer and is isolated from the moisture environment to prevent the moisture from eroding the light-emitting device layer from the borders.

Figure 10:
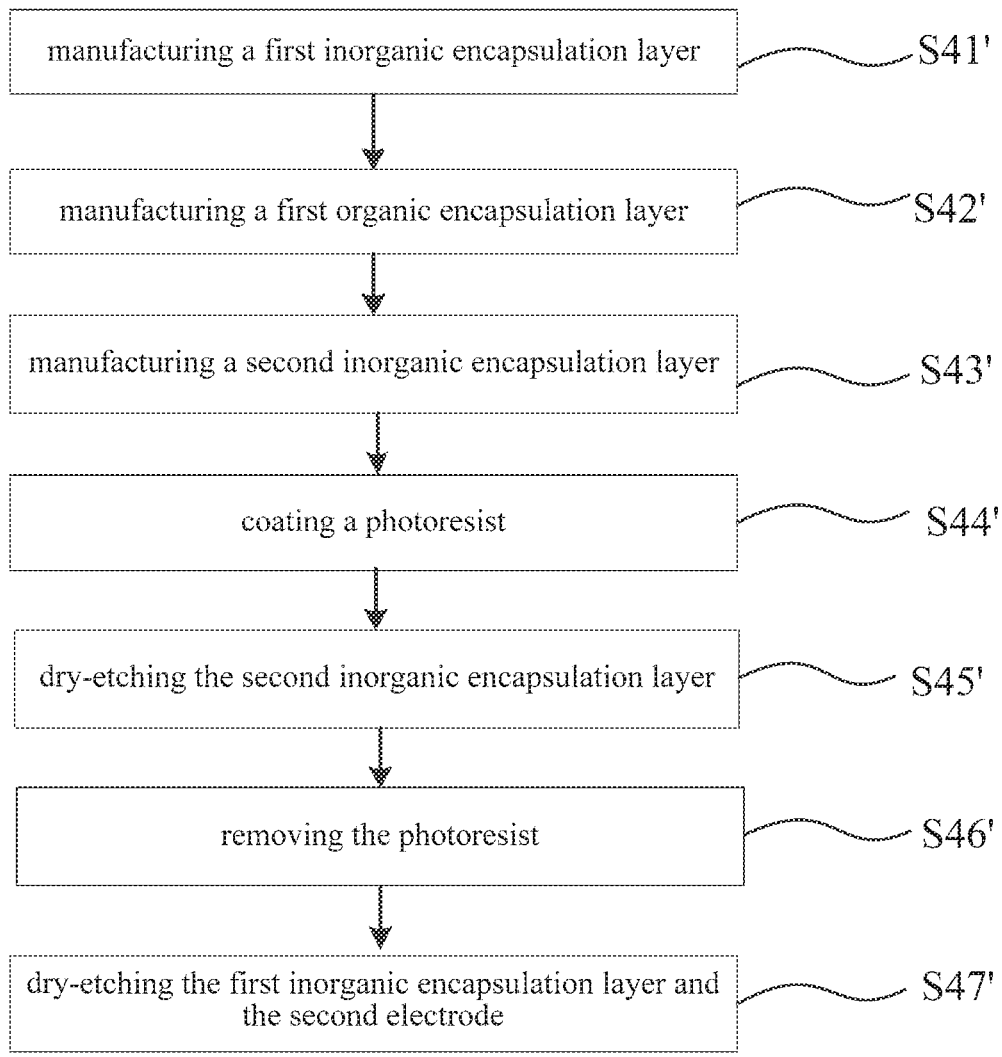
FIG. 10 is a flowchart showing step S4 according to another embodiment of the present disclosure.
Figure 16:
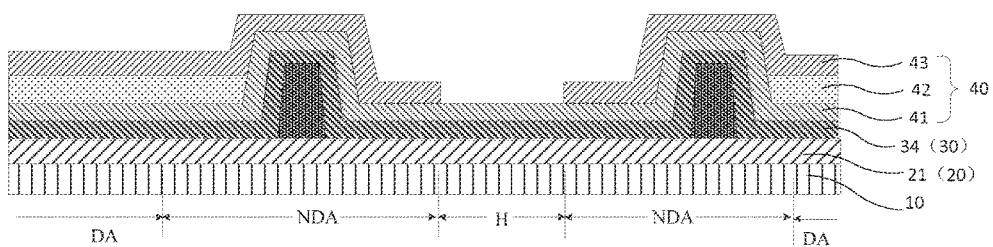
FIG. 16 is a partial structural schematic diagram of a cross section of film layers after a second inorganic encapsulation layer is dry-etched.

Referring to FIG. 10 and FIG. 16. FIG. 10 is a flowchart of step S4 according to another embodiment of the present disclosure; and FIG. 16 is a partial structural schematic diagram of a cross section of film layers after a second inorganic encapsulation layer is dry-etched. This step S4 includes the following steps:

S41': manufacturing a first inorganic encapsulation layer 41;

S42': manufacturing a first organic encapsulation layer 42;

S43': manufacturing a second inorganic encapsulation layer 43;

S44': coating a photoresist;

S45': dry-etching the second inorganic encapsulation layer 43;

S46': removing the photoresist; and

S47': dry-etching the first inorganic encapsulation layer and the second electrode so that borders of the second inorganic encapsulation layer 43, the first inorganic encapsulation layer 41, and the second electrode in the second non-display region are aligned.

In the present embodiment of the present disclosure, the second inorganic encapsulation layer 43 is etched by firstly coating the photoresist on the second inorganic encapsulation layer 43, then the photoresist is removed, and then the second inorganic encapsulation layer 43 is used as a mask to etch the first inorganic encapsulation layer 41 and the second electrode 34, thus preventing the second electrode 34 from being eroded by moisture in the etching process and avoiding further affecting the service life of the light-emitting device layer.

Figure 11:
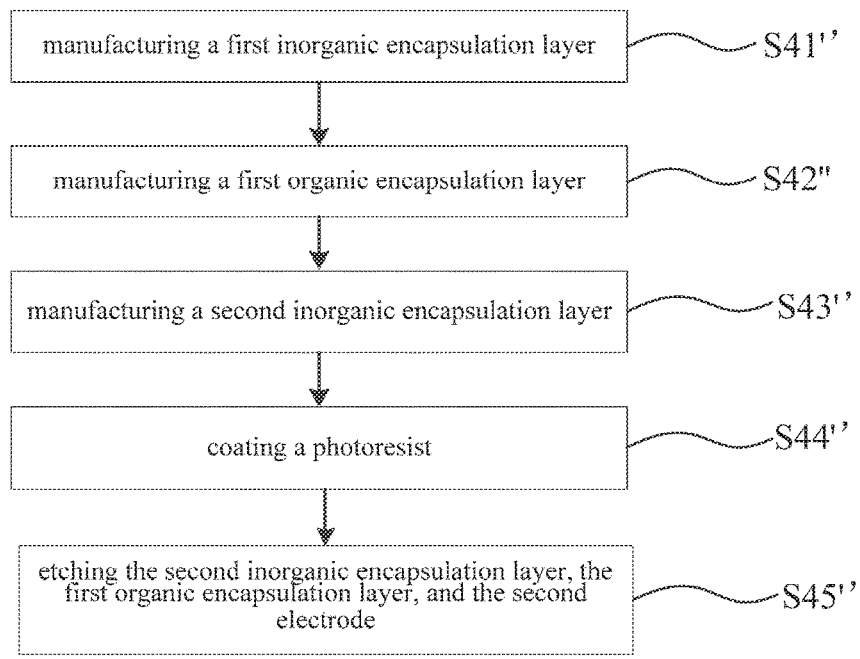
FIG. 11 is a flowchart showing step S4 according to still another embodiment of the present disclosure.
Figure 17:
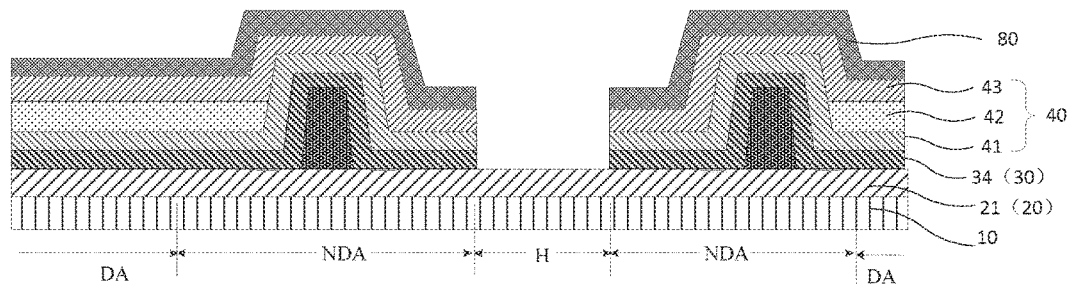
FIG. 17 is a partial structural schematic diagram of a cross section of film layers after a second electrode, a first inorganic encapsulation layer, and a second inorganic encapsulation layer are dry-etched.

Referring to FIG. 11 and FIG. 17, FIG. 11 is a flowchart of step S4 according to still another embodiment of the present disclosure; and FIG. 17 is a partial structural schematic diagram of a cross section of film layers after a second electrode, a first inorganic encapsulation layer, and a second inorganic encapsulation layer are dry-etched. This step S4 includes the following steps:

S41": manufacturing a first inorganic encapsulation layer 41;

S42": manufacturing a first organic encapsulation layer 42;

S43": manufacturing a second inorganic encapsulation layer 43;

S44": coating a photoresist; and

S45": etching the second inorganic encapsulation layer, the first organic encapsulation layer, and the second electrode.

In the present embodiment of the present disclosure, after the second inorganic encapsulation layer 43 is manufactured, a photoresist is coated on the second inorganic encapsulation layer 43, and then the second inorganic encapsulation layer 43, the first organic encapsulation layer 41 and the second electrode 34 are etched; and the photoresist is not removed (as shown in FIG. 17), and an inorganic layer 71 is formed on the photoresist to cover borders J of the second inorganic encapsulation layer 43, the first inorganic encapsulation layer 41, and the second electrode 34 (as shown in FIG. 7 where the photoresist serves as the second organic layer 80 in FIG. 7). In the present embodiment, the photoresist is not removed after etching of the second inorganic encapsulation layer 43, the first inorganic encapsulation layer 41 and the second electrode is completed, so that the second electrode is kept in an anhydrous and oxygen-free environment before being covered by the inorganic layer, thus the light-emitting device layer can be effectively protected from the erosion by the moisture and oxygen. In some embodiments of the present disclosure, a touch layer 90 may be arranged on the inorganic layer 71, and the touch layer 90 may include a touch electrode so that a certain distance exists between the touch electrode and the traces in the thin film crystal layer 20, thus reducing parasitic capacitance between the touch electrode and the traces of the thin-film transistor layer and improving the touch sensitivity.

In some embodiments, a process for manufacturing a first barrier wall 50 in the first non-display region NDA is further included. Referring to FIG. 3, the first barrier wall 50 can be manufactured in the same process together with at least one of the planarization layer 31 or the pixel definition layer 35 in the light-emitting device layer 30, thus saving the manufacturing processes and improving efficiency.

In some embodiments, manufacturing the thin film transistor layer 20 further includes: sequentially manufacturing a buffer layer 21 and an insulation layer 22 on the flexible substrate 10, etching the insulation layer 22 or etching the insulation layer 22 and the buffer layer 21 when etching the second electrode 34, and then covering the borders of the first inorganic encapsulation layer 41 and the second electrode 34 by an inorganic layer, so that the borders are sealed by the inorganic layer, thus obtaining a good encapsulation effect and a narrow frame. In some embodiments, an etching process may be used to manufacture the interlayer insulation layer in the thin film transistor layer 30. The insulation layer 22 or even the insulation layer 22 and the buffer layer 21 may be etched during etching of the interlayer insulation layer, so that there is no insulation layer 22, or no insulation layer 22 and no buffer layer 21 at the cutting edge CL. Etching of the insulation layer 22 or both the insulation layer 22 and the buffer layer 21 by using the same step for etching the interlayer insulation layer cause the inorganic layer covering the borders of the first inorganic encapsulation layer 41 and the second electrode 34 to contact the insulation layer 22 or the buffer layer 21, and because the contact is a contact between the inorganic layers and has a good contact interface and a large contact area, the moisture and oxygen are not easy to permeate, a better encapsulation effect is obtained, and there is no insulation layer or no insulation layer 22 and no buffer layer 21 at the cutting side CL, thus the cutting cracks do not easily form.

Figure 18:
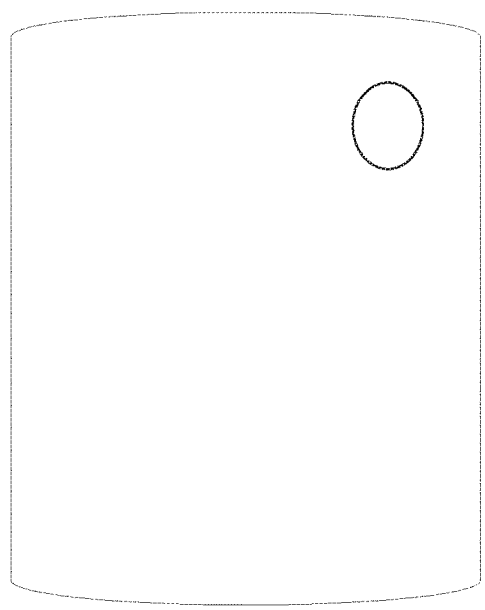
FIG. 18 is a structural schematic diagram of an organic light-emitting display device according to an embodiment of the present disclosure.

The present disclosure provides an organic light-emitting display device including the organic light-emitting display panel provided by the present disclosure. FIG. 18 is a structural schematic diagram of an organic light-emitting display device according to an embodiment of the present disclosure. Referring to FIG. 18, the organic light-emitting display device 1000 includes the organic light-emitting display panel provided by any one of the above embodiments of the present disclosure. In the embodiment of FIG. 18, the mobile phone is only taken as an example to describe the organic light-emitting display device 1000. It can be understood that the organic light-emitting display device provided by the embodiments of the present disclosure may be other display devices having a display function, e.g., a computer, a television, an in-vehicle display device, and the like, which are not specifically limited in the present disclosure. The organic light-emitting display device provided by the embodiments of the present disclosure has the beneficial effects of the organic light-emitting display panel provided by the embodiments of the present disclosure, which can be specifically referred to from the specific description for the organic light-emitting display panel in the above embodiments and will not be elaborated herein.

What is claimed is:

1. An organic light-emitting display panel, comprising:
    a flexible substrate including a display region, an aperture region surrounded by the display region, and a first non-display region located between the display region and the aperture region;
    a thin film transistor layer arranged on the flexible substrate;
    a light-emitting device layer arranged on a side of the thin film transistor layer facing away from the flexible substrate, wherein the light-emitting device layer comprises a first electrode, a light-emitting layer, and a second electrode;
    an encapsulation layer arranged on a side of the light-emitting device layer facing away from the flexible substrate, wherein the encapsulation layer sequentially comprises a first inorganic encapsulation layer and a first organic encapsulation layer on the side of the light-emitting device layer along a direction facing away from the flexible substrate, and borders of the second electrode and the first inorganic encapsulation layer in the first non-display region are aligned, and
    an inorganic layer, wherein the inorganic layer covers the borders of the second electrode and the first inorganic encapsulation layer in the first non-display region.

2. The organic light-emitting display panel according to claim 1, wherein the encapsulation layer further comprises a second inorganic encapsulation layer arranged on a side of the first organic encapsulation layer facing away from the flexible substrate, and the inorganic layer is the second inorganic encapsulation layer.

3. The organic light-emitting display panel according to claim 2, wherein the first inorganic encapsulation layer sequentially comprises a first inorganic encapsulation sub-layer and a second inorganic encapsulation sub-layer along a direction away from the flexible substrate, and an etch rate of the second inorganic encapsulation sub-layer is smaller than an etching rate of the first inorganic encapsulation sub-layer.

4. The organic light-emitting display panel according to claim 3, wherein a ratio of the etch rate of the second inorganic encapsulation sub-layer to the etch rate of the first inorganic encapsulation sub-layer is less than 1:2.

5. The organic light-emitting display panel according to claim 4, wherein a material of the second inorganic encapsulation sub-layer comprises aluminum oxide or iron oxide, and a material of the first inorganic encapsulation sub-layer comprises at least one of silicon nitride, silicon oxide, or silicon oxynitride.

6. The organic light-emitting display panel according to claim 5, wherein the second inorganic encapsulation sub-layer has a thickness of 30 nm to 300 nm, and the first inorganic encapsulation sub-layer has a thickness of 0.5 µm to 2 µm.

7. The organic light-emitting display panel according to claim 6, wherein the second inorganic encapsulation sub-layer is manufactured by an atomic layer deposition, and the first inorganic encapsulation sub-layer is manufactured by a chemical vapor deposition.

8. The organic light-emitting display panel according to claim 1, wherein the encapsulation layer further comprises a second inorganic encapsulation layer arranged on a side of the first organic encapsulation layer facing away from the flexible substrate, borders of the second inorganic encapsulation layer, the second electrode and the first inorganic encapsulation layer in the first non-display region are aligned, and the inorganic layer is arranged on a side of the second inorganic encapsulation layer facing away from the flexible substrate.

9. The organic light-emitting display panel according to claim 8, wherein an etching rate of the second inorganic encapsulation layer is smaller than an etching rate of the first inorganic encapsulation layer.

10. The organic light-emitting display panel according to claim 8, wherein a ratio of an etch rate of the second inorganic encapsulation layer to an etch rate of the first inorganic encapsulation layer is less than 1:2.

11. The organic light-emitting display panel according to claim 10, wherein a material of the second inorganic encapsulation layer comprises aluminum oxide or iron oxide, and a material of the first inorganic encapsulation layer comprises at least one of silicon nitride, silicon oxide, or silicon oxynitride.

12. The organic light-emitting display panel according to claim 11, wherein the second inorganic encapsulation layer has a thickness of 30 nm to 300 nm, and the first inorganic encapsulation layer has a thickness of 0.5 µm to 2 µm.

13. The organic light-emitting display panel according to claim 12, wherein the second inorganic encapsulation layer is manufactured by an atomic layer deposition, and the first inorganic encapsulation layer is manufactured by a chemical vapor deposition.

14. The organic light-emitting display panel according to claim 8, further comprising a second organic layer arranged between the second inorganic encapsulation layer and the inorganic layer.

15. The organic light-emitting display panel according to claim 14, further comprising a touch layer arranged on a side of the inorganic layer facing away from the flexible substrate.

16. The organic light-emitting display panel according to claim 1, further comprising a first barrier wall arranged in the first non-display region, wherein the second electrode and the first inorganic encapsulation layer cover the first barrier wall.

17. The organic light-emitting display panel according to claim 16, wherein the thin film transistor sequentially comprises a buffer layer and an insulation layer along a direction away from the flexible substrate, and the organic light-emitting display panel further comprises a cutting edge without the insulation layer or without the insulation layer and the buffer layer.

18. A method for manufacturing an organic light-emitting display panel, comprising:
providing a flexible substrate, wherein the flexible substrate comprises a display region, a preset aperture forming region, and a first non-display region located between the display region and the preset aperture forming region;
manufacturing a thin film transistor layer on the flexible substrate;
manufacturing a light-emitting device layer on the thin film transistor layer, wherein manufacturing the light-emitting device layer comprises sequentially manufacturing a first electrode, a light-emitting layer, and a second electrode on a side of the thin film transistor layer facing away from the flexible substrate by evaporation;
manufacturing an encapsulation layer on the light-emitting device layer, wherein manufacturing the encapsulation layer comprises manufacturing a first inorganic encapsulation layer, and further comprises a dry-etching step so that borders of the first inorganic encapsulation layer and the second electrode in the first non-display region are aligned;
manufacturing an inorganic layer, wherein the inorganic layer covers the borders of the first inorganic encapsulation layer and the second electrode in the first non-display region; and
cutting the preset aperture forming region to form an aperture region in the flexible substrate.

19. The method according to claim 18, wherein the inorganic layer is a second inorganic encapsulation layer arranged on a side of the first organic encapsulation layer facing away from the flexible substrate.

20. An organic light-emitting display device comprising:
an organic light-emitting display panel, wherein the organic light-emitting display panel includes:
a flexible substrate including a display region, an aperture region surrounded by the display region, and a first non-display region located between the display region and the aperture region;
a thin film transistor layer arranged on the flexible substrate;
a light-emitting device layer arranged on a side of the thin film transistor layer facing away from the flexible substrate, wherein the light-emitting device layer comprises a first electrode, a light-emitting layer, and a second electrode;
an encapsulation layer arranged on a side of the light-emitting device layer facing away from the flexible substrate, wherein the encapsulation layer sequentially comprises a first inorganic encapsulation layer and a first organic encapsulation layer on the side of the light-emitting device layer along a direction facing away from the flexible substrate, and borders of the second electrode and the first inorganic encapsulation layer in the first non-display region are aligned; and
an inorganic layer, wherein the inorganic layer covers the borders of the second electrode and the first inorganic encapsulation layer in the first non-display region.

* * * * *